(12) United States Patent
Park

(10) Patent No.: US 7,148,101 B2
(45) Date of Patent: Dec. 12, 2006

(54) CAPACITORS OF SEMICONDUCTOR DEVICES AND METHODS OF FABRICATING THE SAME

(75) Inventor: Jeong Ho Park, Gyeonggi-do (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 241 days.

(21) Appl. No.: 10/758,346

(22) Filed: Jan. 15, 2004

(65) Prior Publication Data

US 2005/0040492 A1    Feb. 24, 2005

(30) Foreign Application Priority Data

Aug. 18, 2003 (KR) ...................... 10-2003-0056962

(51) Int. Cl.
  *H01L 21/8242* (2006.01)
(52) U.S. Cl. ........................ 438/240; 438/770; 438/775
(58) Field of Classification Search ................ 438/253, 438/254, 255, 396, 769, 770, 775, 240
  See application file for complete search history.

(56) References Cited

U.S. PATENT DOCUMENTS 6,569,731 B1    5/2003  Wu et al. .................... 438/238
6,656,788 B1 *  12/2003 Park et al. .................... 438/253
2002/0095756 A1 * 7/2002  Park et al. .................... 29/25.42
2003/0000645 A1  1/2003  Dornfest ................. 156/345.32
2003/0052335 A1  3/2003  Lachner et al. ............. 257/200

FOREIGN PATENT DOCUMENTS

KR    1020010058485    7/2001

\* cited by examiner

*Primary Examiner*—Tuan H. Nguyen
(74) *Attorney, Agent, or Firm*—Saliwanchik, Lloyd & Saliwanchik

(57) ABSTRACT

Capacitors of semiconductor devices and methods of fabricating the same are disclosed. An example capacitor-fabricating method comprises: forming a first insulating layer by nitrifying a semiconductor substrate; forming a second insulating layer by depositing a transition element on the first insulating layer and performing a reoxidation process; forming a third insulating layer by nitrifying the second insulating layer using a forming gas; and forming a conducting layer on top of the third insulating layer.

15 Claims, 2 Drawing Sheets

CAPACITORS OF SEMICONDUCTOR DEVICES AND METHODS OF FABRICATING THE SAME

FIELD OF THE DISCLOSURE

The present disclosure relates to capacitors of semiconductor devices and, more particularly, to capacitors with a multi-layered nitride-oxide-nitride structure and fabricating methods thereof.

BACKGROUND

In fabricating highly-integrated memory devices such as dynamic random access memory (DRAM), the area of a memory cell to one stored bit as a basic unit of information has decreased. However, the area of the capacitor should not be decreased in proportion to the memory cell size because capacitance per cell must be higher than a particular fixed value so as to prevent a soft error and maintain stable operation.

Conventionally, it is known that the capacitance of a capacitor can be increased by increasing the capacitor area, by decreasing the effective dielectric thickness, or by using a material with a large dielectric constant. When using a material with a large dielectric constant, a dielectric layer for a capacitor may be made of $SiO_2$. Alternatively, the dielectric layer may have a multi-layered nitride-oxide (hereinafter referred to as "NO") structure. This NO structure may use $SiO_2$ or $Si_3N_4$ with a dielectric constant two times larger than that of $SiO_2$, or oxide-nitride-oxide (hereinafter referred to as "ONO") structure. However, since each of $SiO_2$, NO, and ONO has a low dielectric constant, decreasing the thickness of the dielectric or increasing the surface area of the dielectric cannot by itself ensure a high capacitance, and, therefore, a new material is required.

To solve this problem, in highly-integrated DRAM, (Ba, Sr)$TiO_3$ (hereinafter referred to as "BST"), (Pb,Zr)$TiO_3$ (hereinafter referred to as "PZT") and $Ta_2O_5$ are used as the material replacing the existing dielectric. $Ta_2O_5$ has a dielectric constant (e.g., 20~25) which is three times larger than the dielectric constant of silicon nitride. Further, $Ta_2O_5$ is easily etched compared to BST or PZT. In addition, $Ta_2O_5$ has excellent step coverage in chemical vapor deposition (hereinafter referred to as "CVD"). Recently, to improve the unstable stoichiometric ratio of $Ta_2O_5$, TaON is being developed.

In a capacitor using $Ta_2O_5$ as a dielectric film with a large dielectric constant, the materials used for the electrodes have a marked effect on the characteristics of the dielectric. For example, the dielectric film using $Ta_2O_5$ is based on a metal-insulator-silicon (hereinafter referred to as "MIS") structure instead of the existing NO structure. In "MIS", "M" means a metal electrode used as a plate node, "I" means a dielectric as an insulator, and "S" means polysilicon used as a storage node. In the $Ta_2O_5$ capacitor, a plate electrode used as an upper electrode has a multi-layered structure such as polysilicon/TiN or polysilicon/WN, and a storage electrode used as a bottom electrode is made of polysilicon whose surface is finished by rapid thermal nitration (hereinafter referred as to "RTN").

Prior art Korean Patent Publication No. 10-2001-0058485 describes a flash memory device having a double nitride layer with a large dielectric constant which is manufactured by depositing an NON film instead of an ONO film to decrease thickness of a gate. U.S. Pat. No. 6,569,731 describes a method of forming an NON structure. The described method comprises the steps of: using silicon nitride deposition to form a SiN layer on a predetermined capacitor structure, using a reoxidation process to grow an oxide layer on the SiN layer, and using a nitration process with $N_2O$ as a reactive gas in a temperature of 800~1000° C. for 50~90 minutes to form a nitride layer on the oxide layer.

Conventional methods such as those described above cause problems in process stability because the high-temperature process for forming a single or a multi-layered dielectric has a marked effect on a lower dopant profile. Such conventional methods also cause problems in device reliability because the dopant penetrates into the dielectric layer during a subsequent thermal treatment process. In addition, there are problems such as gate depletion rate reduction and leakage current.

DETAILED DESCRIPTION

Figure 1:
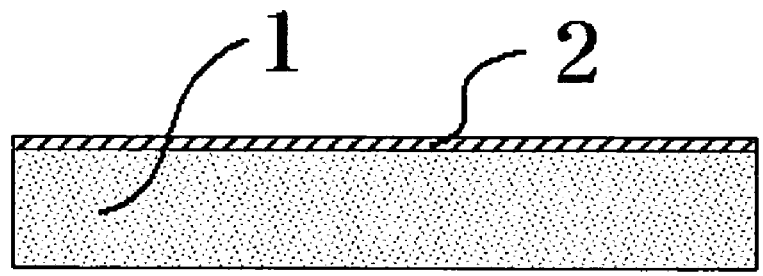
FIGS. 1 through 5 illustrate, in cross sectional views, an example process performed in accordance with the teachings of the present disclosure.

Referring to FIG. 1, a first insulating layer 2 is formed on a semiconductor substrate 1 with at least a predetermined capacitor structure by nitrifying the silicon of the substrate using a forming gas to form silicon nitride. A conductor for a MIM capacitor or nothing may be formed on the substrate before the formation of the first insulating layer 2. The forming gas may be $N_2$ or a mixture of gases including $N_2$ (e.g., a gas mixture including $N_2$ and $H_2$). The process is performed in a furnace at a low temperature, preferably at about 200~450° C.

Figure 2:
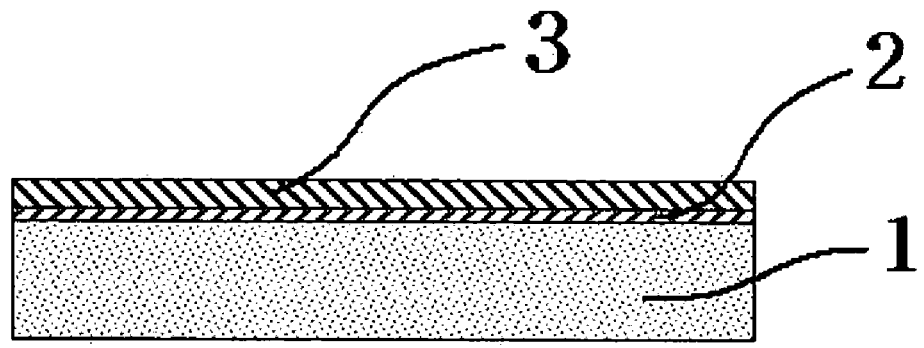

Referring to FIG. 2, a second insulating layer 3 is formed by depositing a transition element with a large dielectric constant using a sputtering method and performing a reoxidation process. The transition element may be Ta, Al, Zr, V, Ti, Ni or Hf. The second insulating layer 3 has a thickness of about 5~500 Å. The reoxidation process is performed at a temperature of about 700~950° C. in a furnace or in chamber equipment through rapid thermal oxidation (hereinafter referred to as "RTO"). The second insulating layer 3 may be formed by directly depositing the transition element oxide by CVD.

Figure 3:
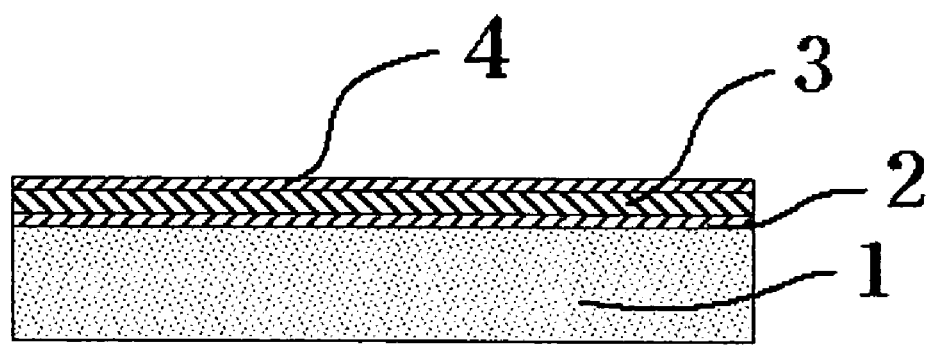

Referring to FIG. 3, a third insulating layer 4 is formed by performing a nitration process in a furnace at a temperature of about 200~450° C. The nitration process is performed using a forming gas. The third insulating layer 4 may be formed by directly depositing an oxide such as one element selected from the group including Ta, Al, Zr, V, Ti, Ni and Hf.

Figure 4:
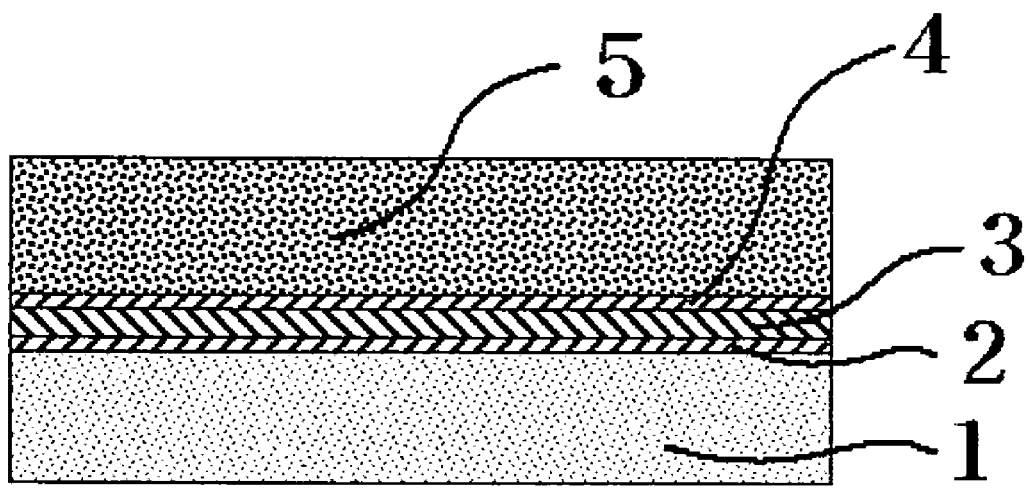

Referring to FIG. 4, a conducting layer 5 is formed on top of the third insulating layer by CVD or PVD. A conductor for the layer may be polysilicon, Si, Al, V, Ni, Cu, Co, W, Ta, Ti or an alloy including at least one of polysilicon, Si, Al, V, Ni, Cu, Co, W, Ta, and/or Ti.

Figure 5:
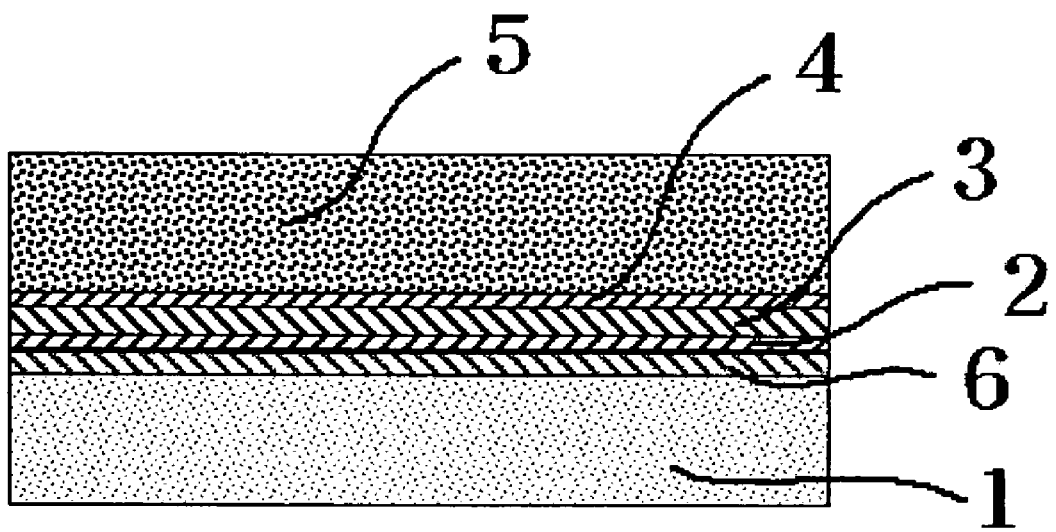

Thus, an example capacitor of the semiconductor device manufactured by the example process explained above comprises a first insulating layer 2, a second insulating layer 3 comprising a transition element oxide, a third insulating layer 4 and a conducting layer 5. Alternatively, as shown in FIG. 5, in order to make a MIM structure, a lower conducting layer 6 may be formed prior to the formation of the first insulating layer 2. The transition element oxide layer 3 of the illustrated example is made of an oxide of one element selected from Ta, Al, Zr, V, Ti, Ni and Hf. The first and the third insulating layers of the illustrated example are nitride layers.

From the foregoing, persons of ordinary skill in the art will appreciate that the above disclosed fabricating methods (a) provide a stable process without changing the dopant profile by forming a dielectric film at a low temperature using a forming gas, (b) prevent the dopant from penetrating into the dielectric film by employing a multi-layered, stack-type dielectric structure, and (c) improve reliability of the manufactured device and yield of the manufacturing process by enhancing leakage current characteristics of the manufactured capacitor.

Persons of ordinary skill in the art will further appreciate that example methods for fabricating a capacitor of semiconductor device have been disclosed comprising: forming a first insulating layer by nitrifying a semiconductor substrate with at least a predetermined capacitor structure using a forming gas; forming a second insulating layer by depositing a transition element on the first insulating layer and performing a reoxidation process; forming a third insulating layer by nitrifying the second insulating layer using a forming gas; and forming a conducting layer on top of the third insulating layer.

Persons of ordinary skill in the art will further appreciate that example methods for fabricating a capacitor of semiconductor device have also been disclosed which comprise: forming a first insulating layer by nitrifying a semiconductor substrate with at least a predetermined capacitor structure using a forming gas; forming a second insulating layer including a transition element oxide on the first insulating layer; forming a third insulating layer by nitrifying the second insulating layer using a forming gas; and forming a conducting layer on top of the third insulating layer.

Persons of ordinary skill in the art will further appreciate that example capacitors of semiconductor device have been disclosed which comprise: a first insulating layer formed on a semiconductor substrate with at least a predetermined capacitor structure; a second insulating layer of a transition element oxide formed on the first insulating layer; a third insulating layer formed on the second insulating layer; and a conducting layer formed on the third insulating layer.

In a preferred example, the first insulating layer is formed on a semiconductor substrate with at least a predetermined capacitor structure by using a nitration process with a forming gas to form silicon nitride on the substrate. The forming gas may be $N_2$ or a gas mixture including $N_2$ (for example, a gas mixture including $N_2$ and $H_2$). The nitration process is performed in a furnace at a low temperature, preferably at a temperature of about 200~450° C. Then, a second insulating layer is formed by depositing a transition element with a large dielectric constant using CVD or a sputtering method, and performing a reoxidation process. The second insulating layer may be formed through directly depositing the transition element oxide by CVD. The transition element may be, for example, Ta, Al, Zr, V, Ti, Ni or Hf. In the illustrated example, the second insulating layer has a thickness of about 5~500 Å. A third insulating layer is formed by performing a nitration process in a furnace at a temperature of about 200~450° C. through forming gas annealing. Subsequently, a conducting layer is formed on top of the third insulating layer by CVD or physical vapor deposition (referred to herein as "PVD"). The conductor may be, for example, polysilicon, Si, Al, V, Ni, Cu, Co, W, Ta, Ti or an alloy including at least one of polysilicon, Si, Al, V, Ni, Cu, Co, W, Ta, and Ti.

Although certain example methods and apparatus have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for fabricating a capacitor of a semiconductor device comprising:
   forming a first insulating layer by nitrifying a semiconductor substrate using a forming gas;
   forming a second insulating layer by depositing a transition element on the first insulating layer and performing a reoxidation process;
   forming a third insulating layer by nitrifying the second insulating layer using a forming gas; and
   forming a conducting layer on top of the third insulating layer.

2. A method as defined in claim 1, wherein a conducting layer is formed on the semiconductor substrate prior to forming the first insulating layer.

3. A method as defined in claim 1, wherein the forming gas comprises $N_2$ gas or a gas mixture including $N_2$.

4. A method as defined in claim 1, wherein at least one of the first insulating layer, the second insulating layer, and the third insulating layer is formed using a furnace process.

5. A method as defined in claim 4, wherein the furnace process is performed at a temperature of about 200~450° C.

6. A method as defined in claim 1, wherein the transition element is one of Ta, Al, Zr, V, Ti, Ni and Hf.

7. A method as defined in claim 1, wherein the transition element is deposited by PVD or CVD.

8. A method as defined in claim 1, wherein the reoxidation process is performed at a temperature of about 700~950° C. by a rapid thermal treatment method.

9. A method as defined in claim 1, wherein the second insulating layer has a thickness of about 5~500 Å.

10. A method as defined in claim 1, wherein the conducting layer comprises one of: polysilicon, Si, Al, V, Ni, Cu, Co, W, Ta, Ti, and an alloy comprising at least one of polysilicon, Si, Al, V, Ni, Cu, Co, W, Ta, and Ti.

11. A method as defined in claim 1, wherein the conducting layer is formed by PVD or CVD.

12. A method as defined in claim 1, wherein the substrate includes at least a predetermined capacitor structure.

13. A method for fabricating a capacitor of a semiconductor device comprising:
   forming a first insulating layer by nitrifying a semiconductor substrate using a forming gas;
   forming a second insulating layer including a transition element oxide on the first insulating layer;
   forming a third insulating layer by nitrifying the second insulating layer using a forming gas; and
   forming a conducting layer on top of the third insulating layer.

14. A method as defined in claim 13, wherein forming the second insulating layer comprises performing CVD.

15. A method as defined in claim 13, wherein the second insulating layer comprises an oxide of one of Ta, Al, Zr, V, Ti, Ni, and Hf.

* * * * *